(12) United States Patent
Masleid et al.

(10) Patent No.: US 7,791,393 B1
(45) Date of Patent: Sep. 7, 2010

(54) PRECISION FALLING EDGE GENERATOR

(75) Inventors: Robert P. Masleid, Monte Sereno, CA (US); Heechoul Park, San Jose, CA (US); Jason M. Hart, Hayden, ID (US)

(73) Assignee: Oracle America, Inc., Redwood City, CA (US)

( * ) Notice: Subject to any disclaimer, the term of this patent is extended or adjusted under 35 U.S.C. 154(b) by 0 days.

(21) Appl. No.: 12/420,540

(22) Filed: Apr. 8, 2009

(51) Int. Cl.
*H03K 3/00* (2006.01)

(52) U.S. Cl. ........................ 327/291; 327/295; 327/174; 327/415

(58) Field of Classification Search .................. None
See application file for complete search history.

(56) References Cited

U.S. PATENT DOCUMENTS

| | | | |
|---|---|---|---|
| 4,985,865 A * | 1/1991 | Houston | 365/194 |
| 5,208,776 A * | 5/1993 | Nasu et al. | 365/200 |
| 6,249,149 B1 * | 6/2001 | Pedersen | 326/93 |
| 7,035,835 B2 * | 4/2006 | Shi et al. | 706/28 |

* cited by examiner

*Primary Examiner*—An T Luu
(74) *Attorney, Agent, or Firm*—Osha • Liang LLP

(57) ABSTRACT

A clock generating circuit includes a source clock, a first clock generated from the source clock through a first header, a second clock generated from the source clock through a second header and an inverter, wherein the second clock is out of phase with respect to the first clock, a first delayed falling edge clock, wherein the first delayed falling edge clock corresponds to the first clock with a first delayed falling edge, and a second delayed falling edge clock, wherein the second delayed falling edge clock corresponds to the second clock with a second delayed falling edge. The first delayed falling edge clock is generated from a first leading edge path and a first falling edge path, both originating from the source clock, that are inputted to a first delay chain.

15 Claims, 4 Drawing Sheets

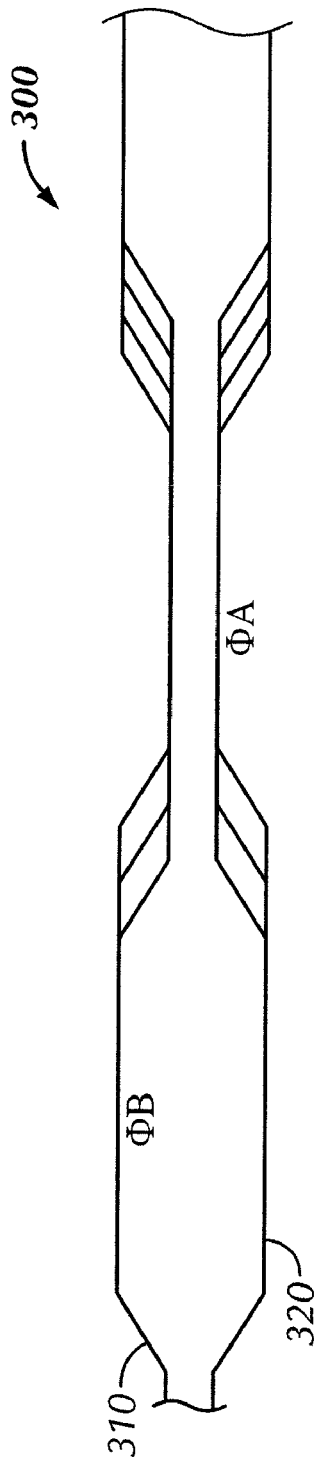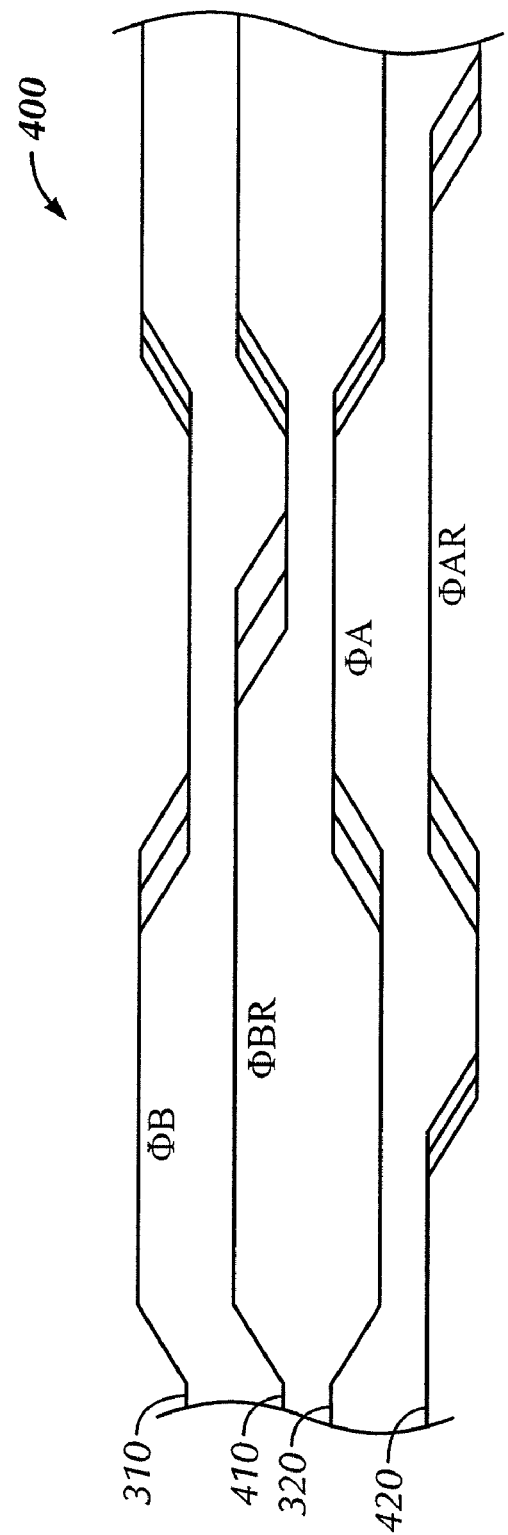

PRECISION FALLING EDGE GENERATOR

BACKGROUND

Conventional VLSI designs are partitioned into phase groups, each controlled by a clock phase. Multi-phased clock designs typically employ delayed falling edge clock signals that allow data to cross clock phase boundaries without incurring a clock accuracy penalty. Conventional clock generators delay the falling edge of a clock signal through the use of a delay chain comprised of inverter gates.

SUMMARY

According to one aspect of one or more embodiments of the present invention, a clock generating circuit includes a source clock, a first clock generated from the source clock through a first header, a second clock generated from the source clock through a second header and an inverter, wherein the second clock is out of phase with respect to the first clock, a first delayed falling edge clock, wherein the first delayed falling edge clock corresponds to the first clock with a first delayed falling edge, and a second delayed falling edge clock, wherein the second delayed falling edge clock corresponds to the second clock with a second delayed falling edge. The first delayed falling edge clock is generated from a first leading edge path and a first falling edge path, both originating from the source clock, that are inputted to a first delay chain. The second delayed falling edge clock is generated from a second leading edge path and a second falling edge path, both originating from the source clock, that are inputted to a second delay chain. The first leading edge path connects the source clock to a first input of the first delay chain. The first falling edge path connects the source clock to a second input of the first delay chain through the first header and one or more inverters. The second leading edge path connects the source clock to a first input of the second delay chain through an inverter. The second falling edge path connects the source clock to a second input of the second delay chain through the second header and one or more inverters. Each delay chain comprises a two-input NOR gate in series with one or more inverters. The output of the first delay chain is the first delayed falling edge clock. The output of the second delay chain is the second delayed falling edge clock.

According to one aspect of one or more embodiments of the present invention, a semiconductor device includes a mechanical package and a semiconductor die. The semiconductor die includes a semiconductor layer, a plurality of metal layers, a clock distribution network that distributes a clock signal within the die, and a clock generating circuit. The clock generating circuit includes a source clock, a first clock generated from the source clock through a first header, a second clock generated from the source clock through a second header and an inverter, wherein the second clock is out of phase with respect to the first clock, a first delayed falling edge clock, wherein the first delayed falling edge clock corresponds to the first clock with a first delayed falling edge, and a second delayed falling edge clock, wherein the second delayed falling edge clock corresponds to the second clock with a second delayed falling edge. The first delayed falling edge clock is generated from a first leading edge path and a first falling edge path, both originating from the source clock, that are inputted to a first delay chain. The second delayed falling edge clock is generated from a second leading edge path and a second falling edge path, both originating from the source clock, that are inputted to a second delay chain. The first leading edge path connects the source clock to a first input of the first delay chain. The first falling edge path connects the source clock to a second input of the first delay chain through the first header and one or more inverters. The second leading edge path connects the source clock to a first input of the second delay chain through an inverter. The second falling edge path connects the source clock to a second input of the second delay chain through the second header and one or more inverters. Each delay chain comprises a two-input NOR gate in series with one or more inverters. The output of the first delay chain is the first delayed falling edge clock. The output of the second delay chain is the second delayed falling edge clock.

According to one aspect of one or more embodiments of the present invention, a system includes an input device, an output device, a mechanical chassis, a printed circuit board, and a semiconductor device. The semiconductor device includes a mechanical package and a semiconductor die. The semiconductor die includes a semiconductor layer, a plurality of metal layers, a clock distribution network that distributes a clock signal within the die, and a clock generating circuit. The clock generating circuit includes a source clock, a first clock generated from the source clock through a first header, a second clock generated from the source clock through a second header and an inverter, wherein the second clock is out of phase with respect to the first clock, a first delayed falling edge clock, wherein the first delayed falling edge clock corresponds to the first clock with a first delayed falling edge, and a second delayed falling edge clock, wherein the second delayed falling edge clock corresponds to the second clock with a second delayed falling edge. The first delayed falling edge clock is generated from a first leading edge path and a first falling edge path, both originating from the source clock, that are inputted to a first delay chain. The second delayed falling edge clock is generated from a second leading edge path and a second falling edge path, both originating from the source clock, that are inputted to a second delay chain. The first leading edge path connects the source clock to a first input of the first delay chain. The first falling edge path connects the source clock to a second input of the first delay chain through the first header and one or more inverters. The second leading edge path connects the source clock to a first input of the second delay chain through an inverter. The second falling edge path connects the source clock to a second input of the second delay chain through the second header and one or more inverters. Each delay chain comprises a two-input NOR gate in series with one or more inverters. The output of the first delay chain is the first delayed falling edge clock. The output of the second delay chain is the second delayed falling edge clock.

Other aspects of the invention will be apparent from the following description and the appended claims.

BRIEF DESCRIPTION OF DRAWINGS

FIG. 3 shows a two-phase non-overlapping clock signal pair in accordance with one or more embodiments of the present invention.

FIG. 4 shows a four-phase clock signal set with delayed falling edges in accordance with one or more embodiments of the present invention.

DETAILED DESCRIPTION

Figure 1:
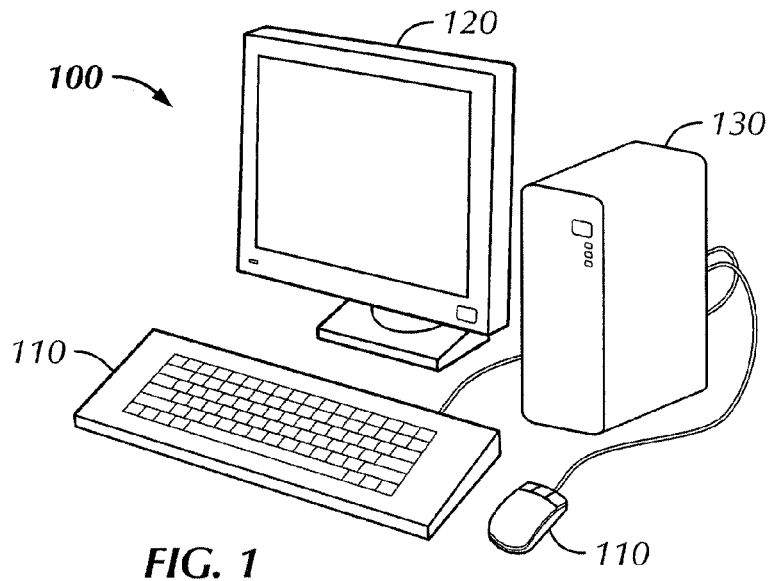
FIG. 1 shows a system in accordance with one or more embodiments of the present invention.

Specific embodiments of the present invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the present invention. In other instances, well-known features have not been described in detail to avoid obscuring the description of embodiments of the present invention.

FIG. 1 shows a system in accordance with one or more embodiments of the present invention. A system 100 includes an input device 110, an output device 120, and a mechanical chassis 130. The mechanical chassis 130 includes a printed circuit board ("PCB"), a network device, and a storage device (not shown).

Figure 2:
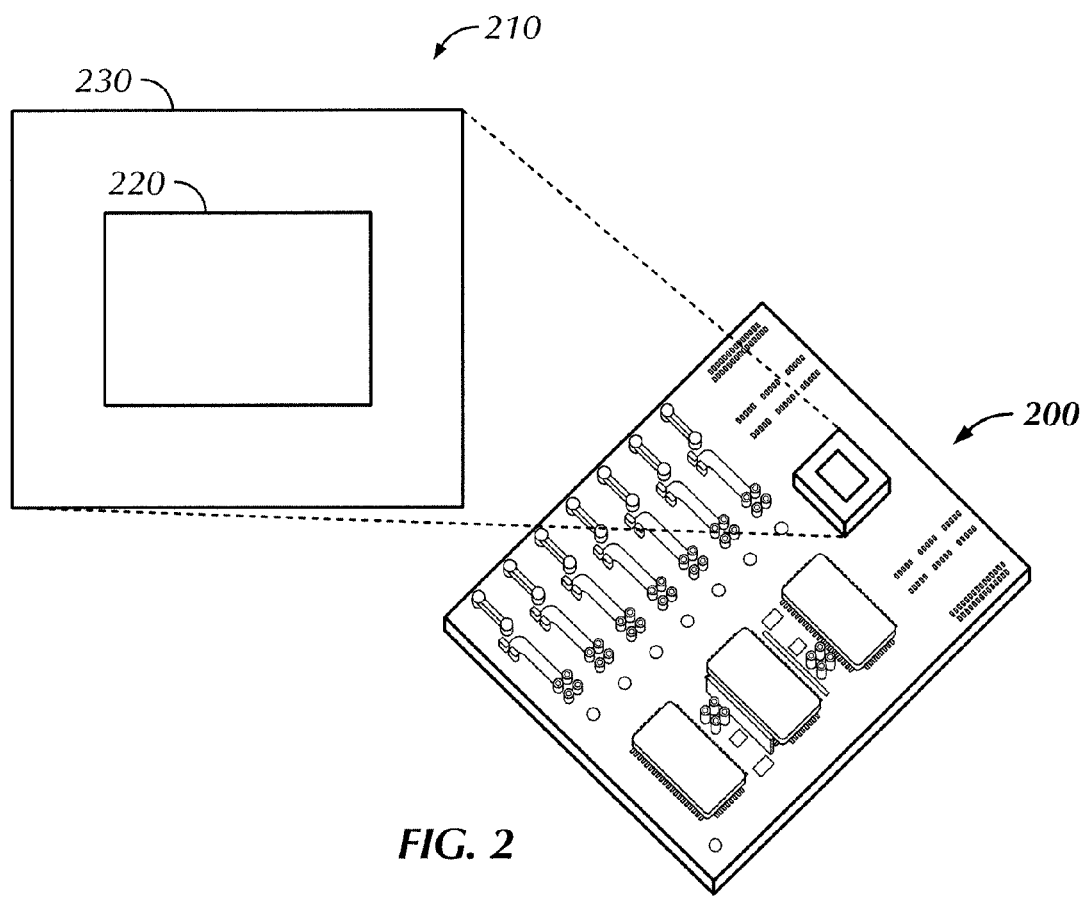
FIG. 2 shows a printed circuit board that includes one or more semiconductor device(s) that each include one or more semiconductor die in accordance with one or more embodiments of the present invention.

FIG. 2 shows a printed circuit board that includes one or more semiconductor device(s) that each include one or more semiconductor die in accordance with one or more embodiments of the present invention. The PCB 200 may be included in system 100 of FIG. 1 and includes one or more semiconductor device(s) 210. Each semiconductor device 210 includes one or more semiconductor die 220 encapsulated in a mechanical package 230. The mechanical package 230 serves as an electrical and mechanical interface between the die 220 and the PCB 200.

The PCB 200 provides one or more external clock signals to the semiconductor device 220. The mechanical package 230 provides the external clock signal(s) to the die 220. The die 220 is comprised of a plurality of metal layers and a semiconductor layer. The die 220 generates one or more internal clock signals that are a function of the provided external clock signal(s). The internal clock signals are typically the most heavily loaded, the most widely distributed, and the fastest signals within the die 220. Clock distribution networks are used to provide the clock signals to the proper loads within the die 220.

The clock distribution network is organized as a hierarchy of three functional layers that distribute the clock within the semiconductor die: the tree layer, the grid layer, and the local layer. The tree layer includes a fractal clock tree that spans a large area of the die. The grid layer includes clock routes to the individual clock users via a clock grid. The local layer includes clock routes to the actual flip-flops and latches.

FIG. 3 shows a two-phase non-overlapping clock signal pair 300 in accordance with one or more embodiments of the present invention. Clock $\phi_B$ 310 is a periodic clock signal with a duty cycle of 50% such that the signal voltage corresponds to the asserted state and the de-asserted state in roughly equal proportions. Clock $\phi_A$ 320 is a periodic clock signal with a duty cycle of 50% that is 180 degrees out of phase with respect to clock $\phi_B$ 310. Because the clocks are complements of one another, they are referred to as non-overlapping.

FIG. 4 shows a four-phase clock signal set 400 with delayed falling edges in accordance with one or more embodiments of the present invention. Clock $\phi_{BR}$ 410 shares the same phase relation to clock $\phi_A$ 320 as clock $\phi_B$ 310, but has a delayed falling edge with respect to clock $\phi_B$ 310. In one or more embodiments of the present invention, the falling edge of clock $\phi_{BR}$ 410 is delayed by a quarter cycle, corresponding to a duty cycle of 75%. One of ordinary skill in the art will appreciate that the amount of delay to the falling edge of clock $\phi_{BR}$ 410 could vary in accordance with one or more embodiments of the present invention. Similarly, clock $\phi_{AR}$ 420 shares the same phase relation to clock $\phi_B$ 310 as clock $\phi_A$ 320, but has a delayed falling edge with respect to clock $\phi_A$ 320. In one or more embodiments of the present invention, the falling edge of clock $\phi_{AR}$ 420 is delayed by a quarter cycle, corresponding to a duty cycle of 75%. One of ordinary skill in the art will appreciate that the amount of delay to the falling edge of clock $\phi_{AR}$ 420 could vary in accordance with one or more embodiments of the present invention.

Figure 5:
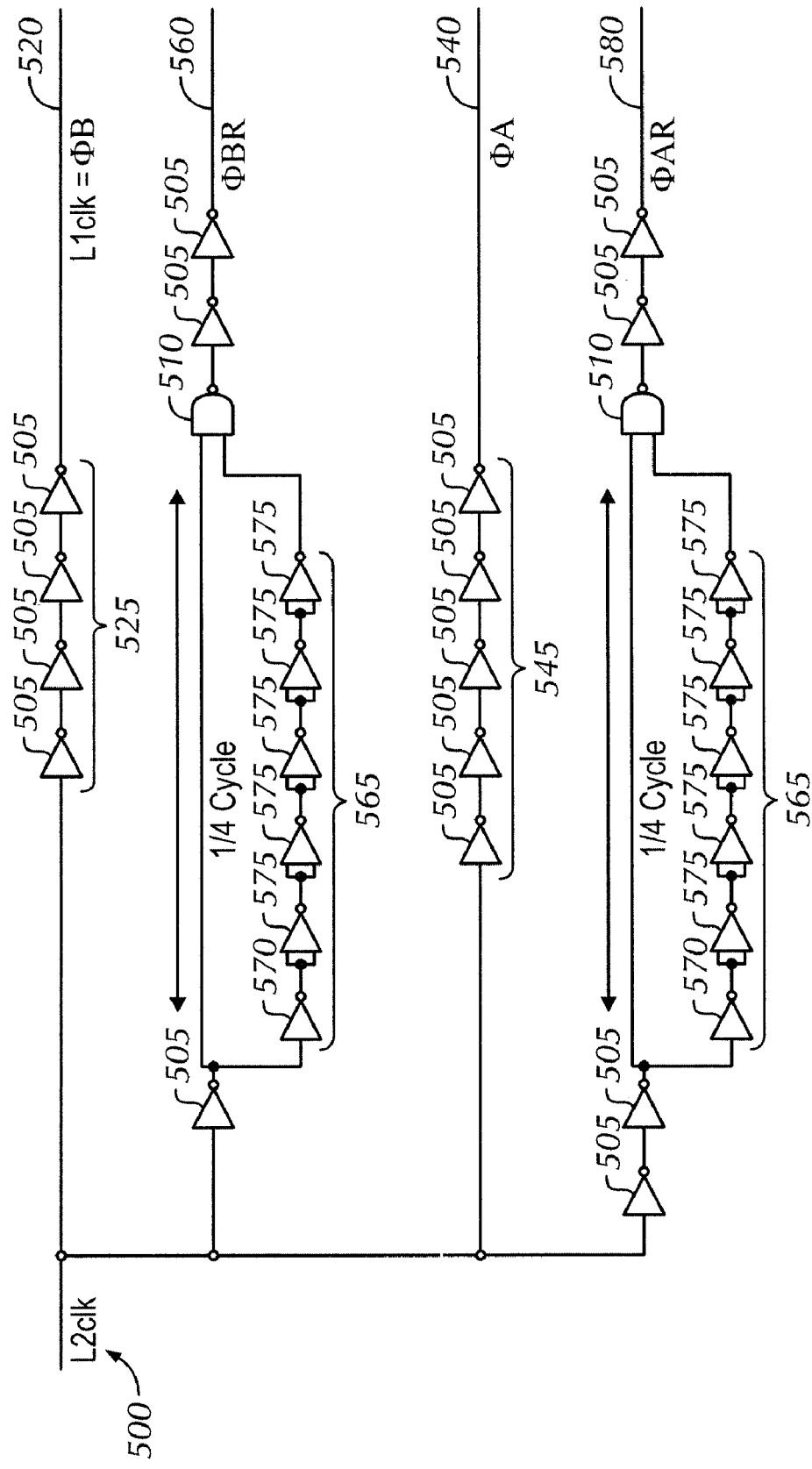
FIG. 5 shows conventional clock generators for producing delayed falling edge clock signals.

FIG. 5 shows conventional clock generators for producing delayed falling edge clock signals. Source clock 500 corresponds to a clock distributed at the local layer of the clock distribution network. One of ordinary skill in the art will recognize that the source clock could correspond to a clock distributed at the grid layer of the clock distribution network in accordance with one or more embodiments of the present invention. The source clock 500 is used to produce downstream clocks $\phi_B$ 520, $\phi_A$ 540, $\phi_{BR}$ 560, and $\phi_{AR}$ 580. Clock $\phi_B$ 520 is produced by source clock 500 routed through a header series 525 of four standard inverters 505 corresponding to a first level header for distributing the source clock 500. Clock $\phi_A$ 540 is produced by source clock 500 routed through a header series 545 of four standard inverters 505 corresponding to a first level header for distributing the source clock 500 and an additional standard inverter 505 for phase shifting. Clock $\phi_A$ 540 is 180 degrees out of phase with clock $\phi_B$ 520. One of ordinary skill in the art will recognize that each header series could vary in accordance with one or more embodiments of the present invention. Further, one of ordinary skill in the art will recognize that the phase shift could vary in accordance with one or more embodiments of the present invention.

Clock $\phi_{BR}$ 560 is produced by source clock 500 routed through a configuration of elements that includes standard inverters 505, an AND gate 510, and a delay chain 565. One of ordinary skill in the art will recognize that the configuration produces a quarter cycle delay on the falling edge of clock $\phi_{BR}$ 560 in comparison to clock $\phi_B$ 520. In other words, the high time of clock $\phi_{BR}$ 560 is three-quarters of the clock cycle, extending the falling edge into the third quarter of the cycle when compared to clock $\phi_B$ 520. Similarly, clock $\phi_{AR}$ 580 is produced by source clock 500 routed through a configuration of elements that includes standard inverters 505, an AND gate 510, and a delay chain 565. One of ordinary skill in the art will recognize that the configuration produces a quarter cycle delay on the falling edge of clock $\phi_{AR}$ 580 in comparison to clock $\phi_A$ 540. In other words, the high time of clock $\phi_{AR}$ 580 is three-quarters of the clock cycle, extending the falling edge into the third quarter of the cycle in comparison to clock $\phi_A$ 540.

The delay chains 565 includes an inverter 570 and five double-stacked inverters 575. One of ordinary skill in the art will recognize that double-stacked inverters 575 are inverters comprised of two P-FETs and two N-FETs that share a common gate node. Further, one of ordinary skill in the art will recognize that the delay chain 565 could vary in the number of inverters 570 and double-stacked inverters 575 to provide a different amount of delay on the falling edge of the clock signal. The inverter 570 and double-stacked inverters 575 are implemented using relatively small devices to reduce the clock power distribution. As such, the delay chain 565 has costs associated with space constraints and power consumption. Additionally, the delay chain 565 is sensitive to process variation that can negatively impact clock accuracy. Specifically, the delay chain 565 is susceptible to variation due to large delay, small device size, the unavailability of shorting bars, and voltage mis-tracking over the $V_{dd}$ operating range. Thus, delay chains are typically avoided in the evaluation path. Delay chains may be used in reset paths, however, the delay chain must be designed to have significantly large margin to allow for the mis-tracking of voltage.

Modern VLSI circuit design topology rules result in the close proximity of delayed falling edge clock signals to their non-delayed counterpart. Standard inverters and other standard logic devices are relatively large compared to their counterparts used in conventional delay chains. Accordingly, in one or more embodiments of the present invention, a delay chain includes a leading edge path corresponding to the source clock to generate a leading edge of a clock signal and a falling edge path corresponding to a first level header and standard logic.

Figure 6:
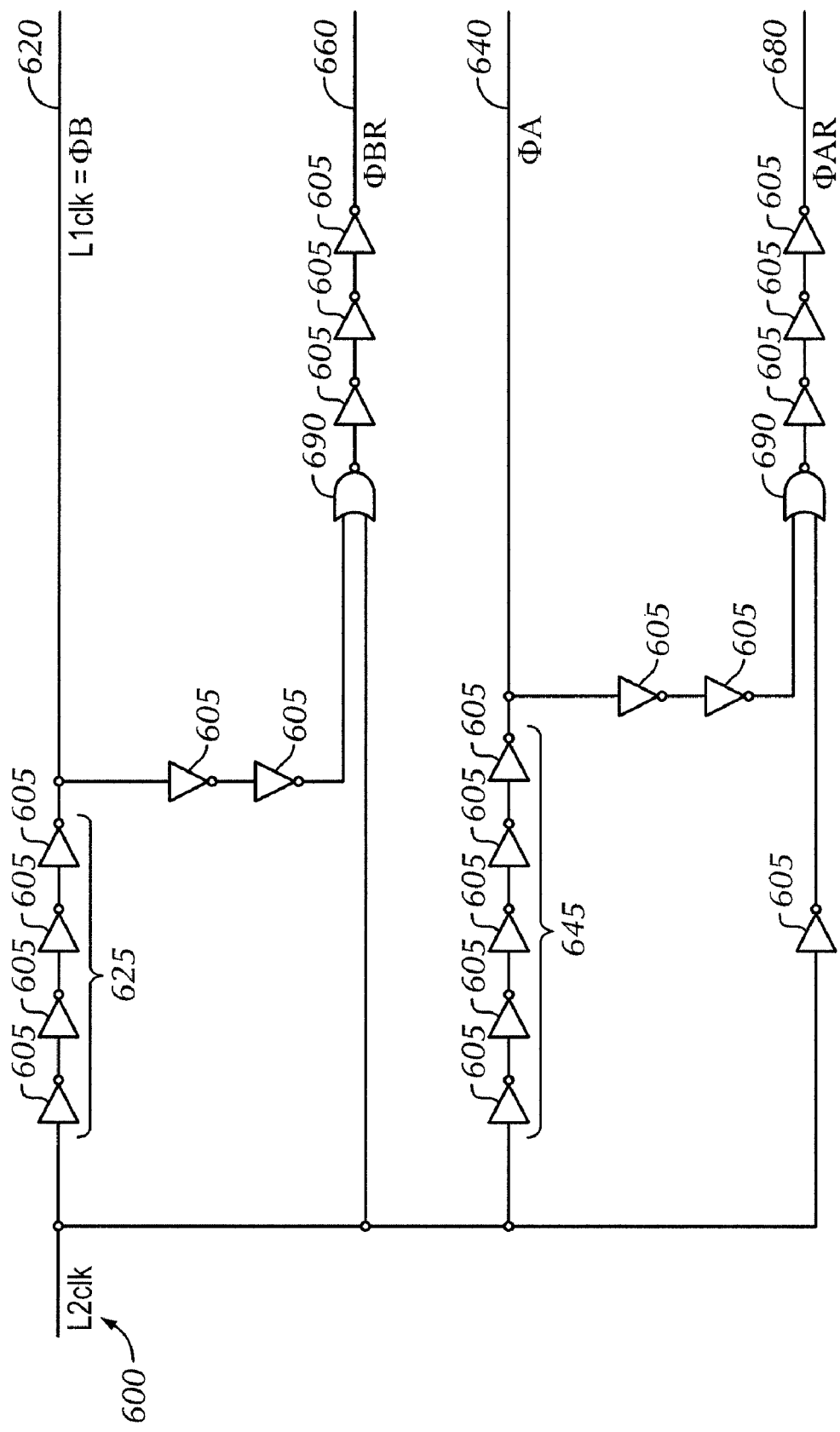
FIG. 6 shows clock generators for producing delayed falling edge clock signals in accordance with one or more embodiments of the present invention.

FIG. 6 shows clock generators for producing delayed falling edge clock signals in accordance with one or more embodiments of the present invention. Source clock 600 corresponds to a clock distributed at the local layer of the clock distribution network. One of ordinary skill in the art will recognize that the source clock could correspond to a clock distributed at the grid layer of the clock distribution network in accordance with one or more embodiments of the present invention. The source clock 600 is used to produce downstream clocks $\phi_B$ 620, $\phi_A$ 640, $\phi_{BR}$ 660, and $\phi_{AR}$ 680. Clock $\phi_B$ 620 is produced by source clock 600 routed through a header series 625 of four standard inverters 605 corresponding to a first level header for distributing the clock signal. Clock $\phi_A$ 640 is produced by source clock 600 routed through a header series 645 of four standard inverters 605 corresponding to a first level header for distributing the clock signal and an additional standard inverter 605 for phase shifting. Clock $\phi_A$ 640 is 180 degrees out of phase with clock $\phi_B$ 620. One of ordinary skill in the art will recognize that each header series could vary in accordance with one or more embodiments of the present invention.

Clock $\phi_{BR}$ 660 is produced by source clock 600 propagated through a leading edge path and a trailing edge path to produce a quarter cycle delay on the falling edge of clock $\phi_{BR}$ 660 in comparison to clock $\phi_B$ 620. One of ordinary skill in the art will appreciate that the amount of delay to the falling edge of clock $\phi_{BR}$ 660 could vary in accordance with one or more embodiments of the present invention. The leading edge path connects the source clock 600 to a first input of a CMOS NOR gate 690. The trailing edge path connects a node separated from the source clock 600 by header series 625, that includes four standard inverters 605 corresponding to a first level header, and connected to a series of two standard inverters 605 whose output connects to a second input of the CMOS NOR gate 690. The output of the CMOS NOR gate 690 connects to a series of three standard inverters 605 whose output is clock $\phi_{BR}$ 660.

Clock $\phi_{AR}$ 680 is produced by source clock 600 propagated through a leading edge path and a trailing edge path to produce a quarter cycle delay on the falling edge of clock $\phi_{AR}$ 680 in comparison to clock $\phi_A$ 640. One of ordinary skill in the art will appreciate that the amount of delay to the falling edge of clock $\phi_{AR}$ 680 could vary in accordance with one or more embodiments of the present invention. The leading edge path connects the source clock 600 to a first input of a CMOS NOR gate 690. The trailing edge path connects a node separated from the source clock 600 by header series 645 that includes a series of four standard inverters 605, corresponding to a first level header and an additional standard inverter 605 for phase shifting, and connected to a series of two standard inverters 605 whose output connects to a second input of the CMOS NOR gate structure 690. The output of the CMOS NOR gate 690 connects to a series of three standard inverters whose output is clock $\phi_{AR}$ 680.

In one or more embodiments of the present invention, the clock generating circuit, semiconductor device, and system use multi-phase clock signals.

In one or more embodiments of the present invention, the clock generating circuit, semiconductor device, and system improve clock accuracy by eliminating large delay, reducing the use of small devices that are more susceptible to process, voltage, and temperature variation, and avoiding voltage mis-tracking.

In one or more embodiments of the present invention, the clock generating circuit, semiconductor device, and system are substantially less sensitive to process, voltage, and temperature variation than the conventional art.

In one or more embodiments of the present invention, the clock generating circuit, semiconductor device, and system reduce the power consumption required to produce one or more delayed falling edge clock signals.

In one or more embodiments of the present invention, the clock generating circuit, semiconductor device, and system reduce the number of parts required to produce one or more delayed falling edge clock signals.

In one or more embodiments of the present invention, the clock generating circuit, semiconductor device, and system are used in reset paths.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A clock generating circuit comprising:
   a source clock;
   a first clock generated from the source clock through a first header;
   a second clock generated from the source clock through a second header and an inverter, wherein the second clock is out of phase with respect to the first clock;
   a first delayed falling edge clock, wherein the first delayed falling edge clock corresponds to the first clock with a first delayed falling edge; and
   a second delayed falling edge clock, wherein the second delayed falling edge clock corresponds to the second clock with a second delayed falling edge;
   wherein the first delayed falling edge clock is generated from a first leading edge path and a first falling edge path, both originating from the source clock, that are inputted to a first delay chain,
   the second delayed falling edge clock is generated from a second leading edge path and a second falling edge path, both originating from the source clock, that are inputted to a second delay chain,
   the first leading edge path connects the source clock to a first input of the first delay chain,
   the first falling edge path connects the source clock to a second input of the first delay chain through the first header and one or more inverters,
   the second leading edge path connects the source clock to a first input of the second delay chain through an inverter, the second falling edge path connects the source clock to a second input of the second delay chain through the second header and one or more inverters, each delay chain comprises a two-input NOR gate in series with one or more inverters, the output of the first delay chain is the first delayed falling edge clock, and the output of the second delay chain is the second delayed falling edge clock.

2. The clock generating circuit of claim 1, wherein the first delayed falling edge clock has a falling edge that is delayed by one quarter of a cycle with respect to the first clock.

3. The clock generating circuit of claim 1, wherein the second delayed falling edge clock has a falling edge that is delayed by one quarter of a cycle with respect to the second clock.

4. The clock generating circuit of claim 1, wherein the first header and the second header correspond to gain stages for distributing the first clock and the second clock respectively.

5. The clock generating circuit of claim 1, wherein the headers, inverters, and delay chains are realized using standard logic.

6. A semiconductor device comprising:
a mechanical package; and
a semiconductor die comprising:
a semiconductor layer,
a plurality of metal layers,
a clock distribution network that distributes a clock signal within the die, and
a clock generating circuit comprising:
a source clock;
a first clock generated from the source clock through a first header;
a second clock generated from the source clock through a second header and an inverter, wherein the second clock is out of phase with respect to the first clock;
a first delayed falling edge clock, wherein the first delayed falling edge clock corresponds to the first clock with a first delayed falling edge; and
a second delayed falling edge clock, wherein the second delayed falling edge clock corresponds to the second clock with a second delayed falling edge;
wherein the first delayed falling edge clock is generated from a first leading edge path and a first falling edge path, both originating from the source clock, that are inputted to a first delay chain,
the second delayed falling edge clock is generated from a second leading edge path and a second falling edge path, both originating from the source clock, that are inputted to a second delay chain,
the first leading edge path connects the source clock to a first input of the first delay chain,
the first falling edge path connects the source clock to a second input of the first delay chain through the first header and one or more inverters,
the second leading edge path connects the source clock to a first input of the second delay chain through an inverter,
the second falling edge path connects the source clock to a second input of the second delay chain through the second header and one or more inverters,
each delay chain comprises a two-input NOR gate in series with one or more inverters,
the output of the first delay chain is the first delayed falling edge clock, and
the output of the second delay chain is the second delayed falling edge clock.

7. The semiconductor device of claim 6, wherein the first delayed falling edge clock has a falling edge that is delayed by one quarter of a cycle with respect to the first clock.

8. The semiconductor device of claim 6, wherein the second delayed falling edge clock has a falling edge that is delayed by one quarter of a cycle with respect to the second clock.

9. The semiconductor device of claim 6, wherein the first header and the second header correspond to gain stages for distributing the first clock and the second clock respectively.

10. The semiconductor device of claim 6, wherein the headers, inverters, and delay chains are realized using standard logic.

11. A system comprising:
an input device;
an output device;
a mechanical chassis;
a printed circuit board; and
a semiconductor device comprising:
a mechanical package, and
a semiconductor die;
wherein the semiconductor die comprises:
a semiconductor layer,
a plurality of metal layers,
a clock distribution network that distributes a clock signal within the die, and
a clock generating circuit comprising:
a source clock;
a first clock generated from the source clock through a first header;
a second clock generated from the source clock through a second header and an inverter, wherein the second clock is out of phase with respect to the first clock;
a first delayed falling edge clock, wherein the first delayed falling edge clock corresponds to the first clock with a first delayed falling edge; and
a second delayed falling edge clock, wherein the second delayed falling edge clock corresponds to the second clock with a second delayed falling edge;
wherein the first delayed falling edge clock is generated from a first leading edge path and a first falling edge path, both originating from the source clock, that are inputted to a first delay chain,
the second delayed falling edge clock is generated from a second leading edge path and a second falling edge path, both originating from the source clock, that are inputted to a second delay chain,
the first leading edge path connects the source clock to a first input of the first delay chain,
the first falling edge path connects the source clock to a second input of the first delay chain through the first header and one or more inverters,
the second leading edge path connects the source clock to a first input of the second delay chain through an inverter,
the second falling edge path connects the source clock to a second input of the second delay chain through the second header and one or more inverters,
each delay chain comprises a two-input NOR gate in series with one or more inverters,
the output of the first delay chain is the first delayed falling edge clock, and
the output of the second delay chain is the second delayed falling edge clock.

12. The system of claim 11, wherein the first delayed falling edge clock has a falling edge that is delayed by one quarter of a cycle with respect to the first clock.

13. The system of claim 11, wherein the second delayed falling edge clock has a falling edge that is delayed by one quarter of a cycle with respect to the second clock.

14. The system of claim 11, wherein the first header and the second header correspond to gain stages for distributing the first clock and the second clock respectively.

15. The system of claim 11, wherein the headers, inverters, and delay chains are realized using standard logic.

* * * * *